(12) United States Patent
Feiweier et al.

(10) Patent No.: US 7,224,165 B2
(45) Date of Patent: May 29, 2007

(54) METHOD, DIELECTRIC ELEMENT, AND MR SYSTEM FOR GENERATING AN MR EXPOSURE

(75) Inventors: Thorsten Feiweier, Poxdorf (DE); Berthold Kiefer, Erlangen (DE); Wolfgang Renz, Erlangen (DE); Lothar Schön, Neunkirchen (DE)

(73) Assignee: Siemens Aktiengesellschaft, Munich (DE)

( * ) Notice: Subject to any disclaimer, the term of this patent is extended or adjusted under 35 U.S.C. 154(b) by 48 days.

(21) Appl. No.: 11/055,313

(22) Filed: Feb. 10, 2005

(65) Prior Publication Data

US 2005/0194974 A1 Sep. 8, 2005

(30) Foreign Application Priority Data

Feb. 10, 2004 (DE) ...................... 10 2004 006 551

(51) Int. Cl.
  *G01V 3/00* (2006.01)
(52) U.S. Cl. ...................... 324/309; 324/318
(58) Field of Classification Search ................ 324/209, 324/318, 319, 322, 307, 300, 309; 600/410, 600/420, 422
See application file for complete search history.

(56) References Cited

U.S. PATENT DOCUMENTS

| 5,227,727 | A  | * | 7/1993  | Segawa et al.    | 324/318 |
| 5,414,358 | A  | * | 5/1995  | Eilenberg et al. | 324/309 |
| 5,552,709 | A  | * | 9/1996  | Anderson         | 324/321 |
| 6,633,161 | B1 | * | 10/2003 | Vaughan, Jr.     | 324/318 |
| 6,774,634 | B2 | * | 8/2004  | Cosman           | 324/321 |
| 2004/0186375 | A1 | | 9/2004 | Vavrek et al. | |

FOREIGN PATENT DOCUMENTS

EP          1 219 971        12/2001

* cited by examiner

*Primary Examiner*—Brij B. Shrivastav
(74) *Attorney, Agent, or Firm*—Schiff Hardin LLP

(57) ABSTRACT

For generating of magnetic resonance exposures of an examination subject, a dielectric element with high dielectric constant is positioned on the examination subject to locally influence the $B_1$ field distribution, the dielectric element being formed primarily of material whose magnetic resonance line(s) is/are shifted by at least a specific degree relative to the magnetic resonance line of water protons for a given magnetic field. In a measurement for generation of a magnetic resonance exposure a measurement sequence is used, such in the acquisition of the raw image data the dielectric material of the dielectric element supplies no signal contributions for the image generation and/or the signals caused by the dielectric material of the dielectric element can be separated from the signals caused by the examination subject.

15 Claims, 2 Drawing Sheets

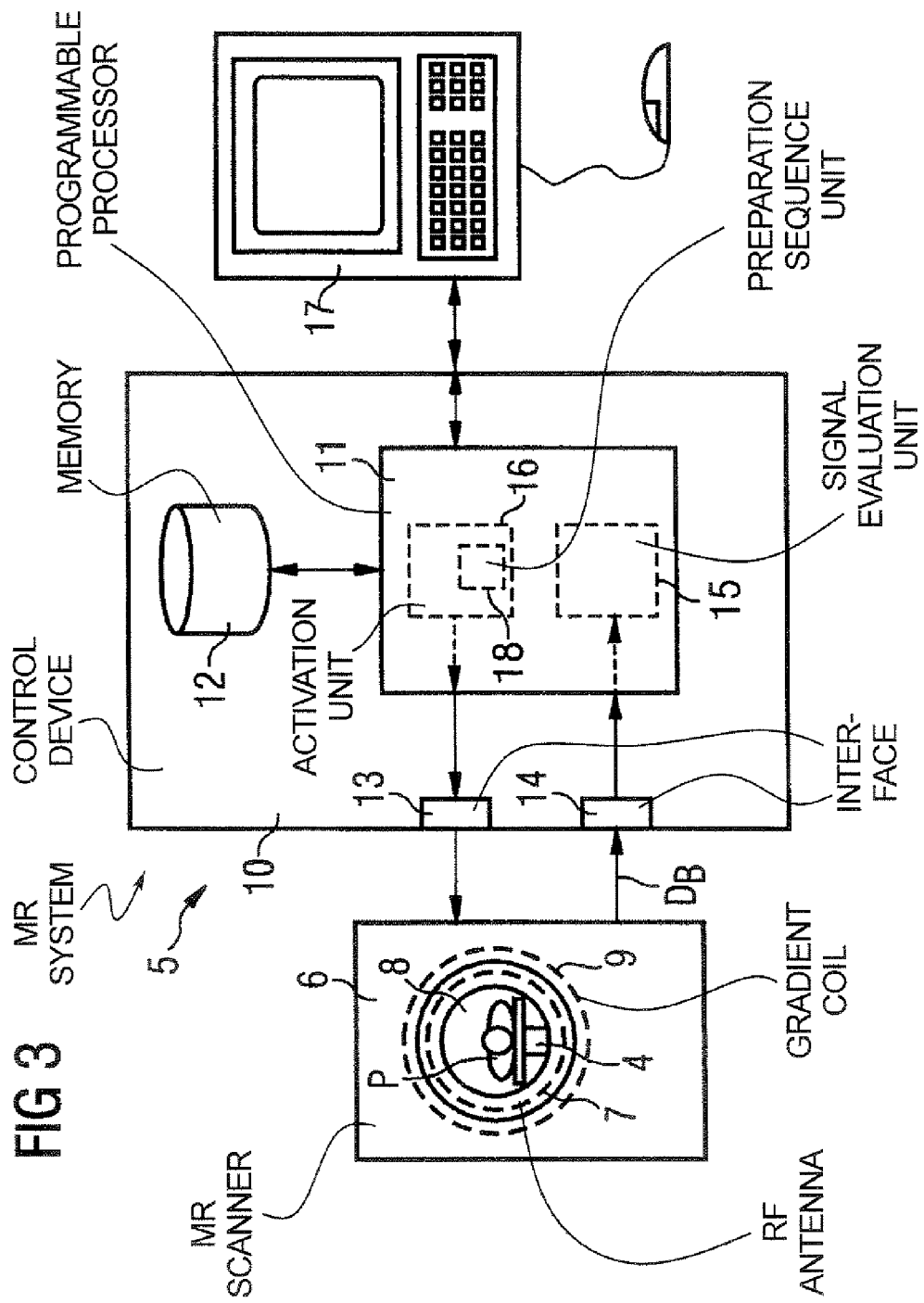

METHOD, DIELECTRIC ELEMENT, AND MR SYSTEM FOR GENERATING AN MR EXPOSURE

BACKGROUND OF THE INVENTION

1. Field of the Invention

The present invention concerns a method for generating magnetic resonance exposures (i.e. acquiring magnetic resonance data) of an examination subject, of the type wherein a dielectric element with high dielectric constant is positioned on the examination subject to locally influence the $B_1$ field distribution. Moreover, the invention concerns a corresponding dielectric element for positioning on an examination subject for locally influencing the $B_1$ field distribution during magnetic resonance data acquisition and a corresponding magnetic resonance system for implementation of the method.

2. Description of the Prior Art

Magnetic resonance tomography has become a widespread technique for the acquisition of images of the inside of the body of a living examination subject. In order to acquire an image with this method, i.e. to generate a magnetic resonance exposure of an examination subject, the body or a body part of the patient to be examined must initially be exposed to an optimally homogeneous static basic magnetic field (usually designated as a $B_0$ field) which is generated by a basic field magnet of the magnetic resonance scanner. During the acquisition of the magnetic resonance data, rapidly switched gradient fields that are generated by gradient coils are superimposed on this basic magnetic field for spatially coding the data. With a radio-frequency antenna, RF pulses of a defined field strength are radiated into the examination volume of the scanner in which the examination subject is located. The magnetic flux density of these RF pulses is typically designated with $B_1$. The pulsed radio-frequency field therefore is generally called a $B_1$ field for short. By means of these RF pulses, the nuclear spins of the atoms in the examination subject are excited such that they are moved out of state of equilibrium spins, which are oriented parallel to the basic magnetic field $B_0$, by what is known as an "excitation flip angle (also called "flip angle" for short in the following). The nuclear spins then precess in the direction of the basic magnetic field $B_0$. The magnetic resonance signals thereby generated are acquired by radio-frequency reception antennas. The reception antennas can be either the same antennas with which the RF pulses were radiated, or separate antennas. The magnetic resonance images of the examination subject are ultimately created based on the received magnetic resonance signals. Every image point in the magnetic resonance image is associated with a small body volume, known as a "voxel", and every brightness or intensity value of the image points is linked with the signal amplitude of the magnetic resonance signal received from this voxel. The connection between a radiated excitation RF pulse with the field strength $B_1$ and the flip angle $\alpha$ achieved by this pulse is given by the equation $$\alpha = \int_{t=0}^{\tau} \gamma \cdot B_1(t) \cdot dt \quad (1)$$

wherein $\gamma$ is the gyromagnetic ratio, which can be considered as a fixed material constant for most magnetic resonance examinations, and $\tau$ is the effective duration of the radio-frequency pulse. The flip angle achieved by an emitted RF pulse, and thus the strength of the magnetic resonance signal, consequently also depends on (aside from the duration of the RF pulse) the strength of the radiated $B_1$ field. Spatial fluctuations in the field strength of the excited $B_1$ field therefore lead to unwanted variations in the received magnetic resonance signal that can adulterate the measurement result.

In the presence of a high magnetic field strength—that unavoidably exists in a magnetic resonance tomography scanner due to the necessary magnetic basic field $B_0$—the RF pulses disadvantageously exhibit an inhomogeneous penetration behavior in conductive and dielectric media such as, for example, tissue. The $B_1$ field thus can significantly vary within the measurement volume. In particular, in examinations known as ultra-intense field magnetic resonance examinations, in which modern magnetic resonance systems are used with a basic magnetic field of three Tesla or more, particular measures must be taken in order to achieve an optimally homogenous distribution of the transmitted RF field of the radio-frequency antenna in the entire volume.

A simple but more effective approach to the solution of the problem is to modify the electrical environment of the examination subject in a suitable manner in order to compensate unwanted inhomogeneities. For this purpose, dielectric elements with defined dielectric constant and conductivity can be positioned in the examination volume, for example directly at the patient or on the patient. The material of these dielectric elements should exhibit an optimally high dielectric constant, preferably $\in \geq 50$. The dielectric material thus produces a dielectric focusing. Conversely, the material of the dielectric element should not exhibit too high a conductivity, since due to the skin effect a conductivity that is too high leads to high eddy currents, in particular in the surface region of the dielectric element, producing a shielding effect that weakens (attenuates) the dielectric focusing effect. For example, using such dielectric elements the typical RF field minima that occur in magnetic resonance examinations of a patient in the chest and abdomen region can be compensated by placing appropriate dielectric elements, which compensate the minima by producing a local increase of the penetrating radio-frequency field, on the chest and abdomen of the patient.

Distilled water with a dielectric constant of $\in \approx 80$ and a conductivity of approximately 10 µs/cm and filled into a plastic film pouch has been used as such a dielectric element. Unfortunately, the use of such "dielectric pillows" filled with water has the unwanted side effect that they are visible in the magnetic resonance exposures. In addition, due to fold over effects the dielectric element may not be imaged within the magnetic resonance exposure at the location at which it is actually positioned in real space. Thus, for example, due to foldover effects the pillow can be shown at the upper edge of an MR image instead of at the lower edge. This leads to the impression being created on the magnetic resonance exposures that the dielectric element is located inside the body of the patient, rather than on the body of the patient. It is in principle possible to acquire an image using an oversampling method such that the dielectric element is at the correct position. In such a case, the dielectric element can be excised by image processing an image section can be selected which does not contain the dielectric element at all. These oversampling methods, however, are quite time-consuming and therefore prolong the measurement time. Moreover, independent of the oversampling methods, given movement (for example due to breathing of the patient) the MR signal from the pillow can also lead to interfering image artifacts within the region of the magnetic resonance exposure depicting the body.

SUMMARY OF THE INVENTION

An object of the present invention is to provide a method for generating magnetic resonance exposures using dielectric elements as well as a dielectric element and a corresponding magnetic resonance system for implementation of such a method, wherein interferences in the magnetic resonance exposures are reduced or even entirely prevented in a simple manner by the positioned dielectric elements.

This object is inventively in a method of the above type wherein dielectric element is primarily composed of a dielectric material whose magnetic resonance line(s) is/are shifted by at least a specific degree relative to the magnetic resonance line of water protons for a given magnetic field (i.e. a specific $B_0$ field). This means that all significant parts of the dielectric element which could lead to larger interfering effects in the image are composed of such a dielectric material. This dielectric material does not necessarily have to be a single material, but can be a material mixture.

Given a dielectric element in the form of a pillow, this would mean that the filling of the pillow (which conventionally has been water) is replaced by dielectric material as described above. The relatively thin shell of plastic film normally does not present a problem anyway, since it is a solid material which typically exhibits a very short $T_2$ relaxation time in the sub-ms range. This material therefore is not visible anyway in most applications. Nevertheless, materials can be used for the pillow jacket that also have a high dielectric constant and a low conductivity and magnetic resonance line(s) shifted relative to the magnetic resonance line of water protons.

In the generation of the magnetic resonance exposures, the invention ensures that, in a measurement sequence, for the acquisition of the raw image data, the dielectric material of the dielectric element supplies no signal contribution to the image generation and/or the signals caused by the dielectric material can be separated without difficulty from the signals caused by the examination subject. As used herein, a "measurement sequence" includes at least one excitation pulse (but normally a number of measurement pulses), in addition to one or more image acquisition pulse sequences with one or more pulses which serve for excitation of the protons for the actual acquisition of the raw image data) the measurement sequence can additionally also comprise one or more pre pulse sequences—with one or more preparation pulses in turn—in order to, for example, saturate specific material or to achieve similar effects.

If the magnetic resonance line or lines is/are shifted far enough, it is possible in the acquisition of the raw image data to use a measurement sequence such that only materials with a water proton magnetic resonance line are specifically excited, and for this reason the appertaining dielectric material of the dielectric element supplies no signal contribution. Likewise, by the emission of a preparation pulse sequence the dielectric material of the dielectric element can be specifically excited before the data acquisition, such that the dielectric material no longer supplies signal contributions in the subsequent acquisition of the raw image date for the image generation. A similar technique is known for fat saturation, i.e. the signal of the appertaining material of the dielectric element is (like, for example, the body fat) saturated by a suitable, spectrally-selective method such that it is no longer visible in the acquired images.

In accordance with the invention, the dielectric element is essentially composed of dielectric materials that exhibit a chemical shift of the protons therein relative to the water protons, and this shift of the magnetic resonance line(s) of the dielectric material of the dielectric element relative to the water protons is utilized on a measurement sequence, such that the dielectric element is ultimately invisible in the acquired images. Since the dielectric elements (which are diagnostically irrelevant and in many cases even interfering) are not visible in the images, an additional use of data acquisition time to prevent foldover artifacts can be foregone. Nevertheless, the desired homogenization effect is achieved in a simple manner with the use of the dielectric elements.

In addition to a radio-frequency antenna for emission of radio-frequency pulses in an examination volume and gradient coils for application of gradient fields in the examination volume, a magnetic resonance system for implementation of the method must include: a control device in order to activate the radio-frequency antenna and the gradient coils such that a measurement sequence to generate a desired magnetic resonance exposure of an examination subject located in the examination volume is implemented. The system must also include a reception arrangement for the magnetic resonance signal excited by the radio-frequency pulse sequence, a and a computer to reconstruct the magnetic resonance exposure of the examination subject from the measured signals. The inventive control device operates such that such a measurement sequence is used in the data acquisition for generation of a magnetic resonance exposure, such that during acquisition of the raw image data a dielectric element, positioned on the examination subject for locally influencing the $B_1$ field distribution, the dielectric element being composed substantially of dielectric material whose magnetic resonance line(s) is/are shifted by at least a specific degree relative to the magnetic resonance line of water protons for a given magnetic field, supplies no signal contributions for the image generation, and/or the signals caused by the appertaining dielectric material can be separated from the signals caused by the examination subject.

Since typical magnetic resonance systems include a programmable control device anyway, the inventive control device preferably is realized by suitable control software in such a programmable control device. This means that a computer program product is loaded into the memory of the programmable control device of the appertaining magnetic resonance system, the computer program product includes a program code in order to activate the radio-frequency antenna and the gradient coils for the emission of the desired measurement sequences according to the inventive method. This software embodiment has the advantage that existing magnetic resonance systems or existing control devices can be upgraded in a simple manner at any time, such that the inventive method can be used together with the use of the inventive dielectric elements.

In principle, various dielectric materials can be considered for use in the inventive dielectric element. The requirements for the materials are that they exhibit a high dielectric constant, preferably $\in \geq 50$, and a low conductivity. It is particularly desirable for the conductivity to be approximately in the range of or even below the conductivity of the distilled water conventionally used as dielectric material. Furthermore, it is advantageous for the dielectric material to exhibit only a few magnetic resonance lines, in the optimal case only one line, or an optimally small frequency bandwidth or the lines, such that the frequency range to be saturated is quite limited when a saturation method is used.

In the following—insofar as it is not explicitly mentioned differently—for simplicity it is assumed that there is only one magnetic resonance line in the explanation of the measurement methods and measurement sequences and the general explanation of the requirements of the material. However, this does not preclude that the dielectric material exhibiting a number of magnetic resonance lines that fulfill the aforementioned conditions.

In a preferred exemplary embodiment, the magnetic resonance line of the dielectric material of the dielectric element exhibits at least a relative separation of approximately 3.3 ppm from the magnetic resonance line of water protons. The magnetic resonance line of the water protons in the body is found at approximately 42.575575 MHz/T·$B_0$, i.e. given a $B_0$ field of 3 T this line lies at 127.726725 MHz. In contrast, the line of protons bonded in fat molecules is shifted by approximately 3.3 ppm, i.e. is approximately 420 Hz lower at 3 T. Since it has proven to be the case that relatively good saturation methods are applicable at this frequency separation, the magnetic resonance line of the dielectric material of the dielectric element preferably should likewise exhibit at least a relative separation of approximately 3.3 ppm from the magnetic resonance line of water protons. In a preferred variant, the magnetic resonance line of the dielectric material exhibits the fat-water separation of 3.3 ppm as precisely as possible, i.e. the magnetic resonance line of the dielectric material approximately coincides with the magnetic resonance line of the protons bonded in body fat. Given the use of such a dielectric material, the dielectric element can then also be saturated simultaneously with a fat saturation pulse, and thus is invisible in the resulting image. An expansion of the measurement sequence in order to also saturate other ranges would then be unnecessary.

Given use of such a dielectric material, however, it would not be possible to make an exposure of the fat tissue without simultaneously also seeing the dielectric element. Therefore, in a different preferred variant, the resonance line of the dielectric material additionally exhibits at least a relative separation of approximately 3.3 ppm from the magnetic resonance line of the protons bonded in body fat. For example, the resonance line of the dielectric material can exhibit at least a relative separation of approximately 6.6 ppm from the magnetic resonance line of water protons. Given use of such dielectric elements, the fat saturation and saturation of the signal of the dielectric element of the same quality can be achieved independently of one another.

An organic carbonate, in particular a cyclical carbonate or a mixture of various organic carbonates (in particular cyclocarbonates) preferably is used as the dielectric material for the dielectric element. These can, if applicable, be substituted for by halogen atoms such as fluorine, chlorine, bromine and/or iodine.

Experiments have shown that ethylene carbonate and propylene carbonate or a mixture of the two are particularly well suited as dielectric materials for the dielectric element. Both materials exhibit a high dielectric constant and a low conductivity and have a sufficient separation in terms of their magnetic resonance lines relative to the magnetic resonance line of water protons. In addition, both materials exhibit a low risk potential with regard to the flammability, toxicity, etc.

Thus, for example, propylene carbonate (4-methyl-1,3-dioxolan-2-on) exhibits a dielectric constant of $\in$=64.4. At 6.9 mS/cm, the conductivity lies below the conductivity of distilled water. The resonance lines of this material are shifted by approximately 4 ppm and 7 ppm relative to those of water protons, which corresponds to approximately 500 Hz or, respectively, 900 Hz at 3 T. Ethylene carbonate (1,3-dioxolan-2-on) exhibits a dielectric constant of $\in$=89.6 and possesses a conductivity of only 5.2 mS/cm. The resonance lines for this material are in the same range as with propylene carbonate.

In principle, mixtures made from these materials can also be used, since the dielectric element should exhibit optimally few magnetic resonance lines, generally only one material is used.

The measurement sequence that is best suited to cause the appertaining dielectric material of the dielectric element not to be visible in the image exposure depends on, among other things, the actual position of the magnetic resonance lines relative to the magnetic resonance line of the water protons. In principle, as mentioned above, the used of the many varied methods is possible.

Thus an image acquisition pulse sequence can be used as a measurement sequence in the acquisition of the raw data for the image generation, with which only materials with a specific magnetic resonance line (for example with the water proton magnetic resonance line or the fat proton magnetic resonance line) are excited. This means that only the respective imaging species is selectively excited.

Alternatively, by the emission of a preparation pulse sequence, the material of the dielectric element can be specifically excited, such that this material supplies no signal contributions given a subsequent measurement of the raw image data for the image generation. This means that the material to be suppressed is selectively saturated. A disadvantage of the saturation is that saturated components with the $T_1$ relaxation time are again visible. Therefore, the image acquisition should be completed within the decay of the $T_1$ relaxation time. The advantage of such a saturation with the aid of preparation pulses is that the preparation pulse sequences can be simply placed before existing image acquisition pulse sequences, and this no further modifications are necessary.

One possibility for spectrally-selective excitation of the signal-producing proton species is, for example, to combine spectrally-selective RF pulses with spatially-selective RF pulses within the pulse sequence. In this manner, the desired species of a slice can be specifically excited. Thus, for example, initially a pulse known as a 90° CHESS pulse (Chemical Shift Selective Imaging Pulse with $\alpha$=90°) can be used that excites the desired proton species within the entire volume. A slice-selective 180° standard pulse that refocuses only a slice subsequently ensues. Since the entire volume is excited, however, a multi-slice method is no longer possible. Therefore, the radiation of a 90° CHESS pulse that initially excites the unwanted proton species in the entire volume is simpler. The transversal magnetization of this species is then dephased by suitable gradient pulses. A standard imaging then subsequently ensues with the remaining species. A multi-slice method is also applicable with this method.

In principle it is also possible to achieve simultaneous spectral and spatial selectivity by insightful design of the RF pulses. The basic requirement for this is a homogenous $B_0$ field over the entire examination subject. A precision of at least 1 to 2 ppm must be achieved. Then, for example, compound pulses can be used, i.e. a number of successive "hard" RF pulses are radiated in the temporal interval, and these RF pulses rotate the spins of a selected off-resonant frequency range by a defined angle, for example 90° or 180°. Spins within a range around resonance are then rotated as well, such that they are again parallel to the external magnetic field $B_0$ after the end of the pulse series.

A further possibility to separate the signals caused by the dielectric material of the dielectric element from the signals caused by the examination subject is the use of a method known as the echo-time encoding method (Dixon method). In this measurement method, the spectroscopic information is coded in an additional dimension. In contrast to a real four-dimensional imaging, in which three dimensions reproduce the spatial information and one dimension reproduces the spectroscopic information, as with a normal imaging the raw image data are acquired with an applied readout gradient, and the spectral information are acquired by an incremented temporal shifting of the echo position. This means that, by deliberately separating the spin-echo and the gradient-echo conditions, a separation ensues of the desired imaging signal from the signals of the material that should not be visible. An advantage of this method is that the number of the increments determines the spectroscopic resolution. In the extreme case—given only two magnetic resonance lines in the spectrum—the number of the increments is reduced to two. A combination of both of the acquired data sets allows the generation of various images that essentially represent only the desired species. The method is based on evolution intervals whose duration is selected such that the protons of the desired species directly establish a phase difference of 180° relative to the unwanted species. Normally, however, it is always necessary to acquire at least two images and to separate the individual images of both atomic species from one another by suitable post-processing. The measurement time is thereby extended by at least a factor of 2.

A further alternative method is known as the gradient reversal method, in which the slices of both atomic species excited by the radio-frequency pulses are spatially shifted with respect to one another, and the shift direction depends on the algebraic sign of the slice selection gradients. This leads to the slices overlapping only for the resonant species given radiation of slice-selective 90° and 180° pulses, with opposite algebraic signs of the slice selection gradients. By contrast, the non-resonant species have no overlapping, so that a spin echo can only be measured (acquired) from the resonant species. This method is applicable for very thin slices, i.e. with very small slice selection gradients in which the offset in the direction of the basic magnetic field is greater than the excited slice thickness.

DESCRIPTION OF THE DRAWINGS

FIG. 3 schematically illustrates an inventive magnetic resonance system.

DESCRIPTION OF THE PREFERRED EMBODIMENTS

Figure 1:
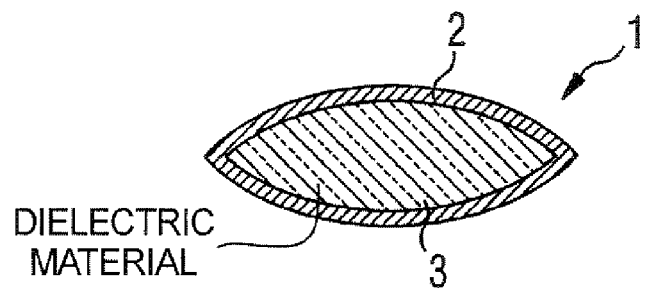
FIG. 1 is a schematic illustration of section through a dielectric pillow, as used in accordance with the invention.

The dielectric element shown in FIG. 1 is a dielectric pillow 1, formed of an outer jacket made of plastic film 2 and a filler of dielectric material 3. The plastic film 2 is a bio-compatible material that is relatively thin but nevertheless is sufficiently stable to prevent leakage of the dielectric material 3 contained therein. The plastic film 2 preferably is fused all around the periphery of the dielectric pillow 1.

In addition, the dielectric pillow 1 in use can be covered with a washable pillowcase which can be changed before usage of the dielectric pillow 1 on another patient. The plastic jacket 2 can be disinfected with typical means.

The filling of the dielectric pillow 1, i.e. the dielectric material 3 of which the dielectric element 1 is essentially formed, exhibits only magnetic resonance lines that are shifted by a specific degree relative to the magnetic resonance line of water protons given a given magnetic field.

The concrete exemplary embodiment is either propylene carbonate (4-methyl-1,3-dioxolan-2-on) or ethylene carbonate (1,3-dioxolan-2-on), both of which exhibit a high dielectricity constant of far above $\in=50$ and a low conductivity of below 10 mS/cm. Moreover, the spectral resonance lines of these materials are sufficiently shifted relative to the magnetic resonance lines of water. The precise values are specified above.

Figure 2A:
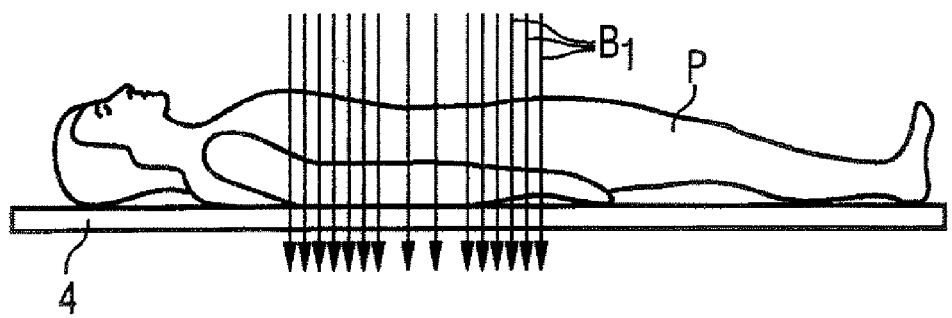
FIG. 2a schematically illustrates a patient positioned on a bed during radiation of a $B_1$ field, without dielectric pillow.
Figure 2B:
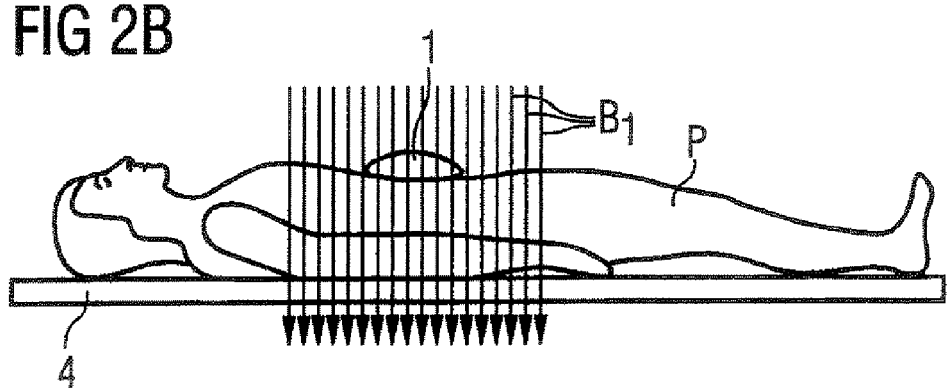
FIG. 2b schematically illustrates a patient according to FIG. 2a during radiation of a $B_1$ field with positioning of a dielectric pillow according to FIG. 1 on the abdomen of the patient.

The effect of such a dielectric element 1 for homogenization of the $B_1$ field in a magnetic resonance exposure is schematically shown using FIGS. 2a and 2b.

FIG. 2a shows a patient P located on a patient bed 4 within a magnetic resonance tomography apparatus (not shown in FIG. 2a). A $B_1$ field, which here is schematically represented by field lines, is emitted by a radio-frequency antenna of the magnetic resonance tomography apparatus. The thickness of the field lines should represent the strength of the $B_1$ field. In the abdomen region of the patient P, a local minimum of the $B_1$ field is shown, which typically occurs in the abdomen and chest region of the patient in a magnetic resonance exposure (scan) under real conditions. In this region, the field lines are less thick than in the remaining regions.

This effect is compensated by the application of the dielectric pillow 1 according to FIG. 1 on the abdomen of the patient P. This is schematically shown in FIG. 2b. The dielectric pillow 1 produces a local increase of the $B_1$ field in the region of the pillow 1. Thus overall the field inhomogeneity is cancelled, such that a more homogenous $B_1$ field exists than without the dielectric pillow 1.

In a measurement for generation of a magnetic resonance exposure, a measurement sequence is used such that the appertaining material 3 of the dielectric element 1 supplies no signal contributions for the image generation in the acquisition of the raw image data $D_B$, by the dielectric material 3 being specifically saturated beforehand, for example by the emission of a preparation pulse sequence.

In a first variant for saturation of the dielectric material 3, for example, a spectrally-selective RF pulse is initially applied with a relatively narrow frequency window around the magnetic resonance lines of the appertaining dielectric material 3, and no gradient is activated. The nuclear spins of the protons of the dielectric material 3 are thereby tilted by approximately $\alpha=90°$ and then precess around the $B_0$ vector of the basic magnetic field. A field known as a "spoiler" gradient is subsequently applied, i.e. a gradient pulse with specific length is applied in one or more directions, which dephases the rotating spins. In this manner, the sum signal within a voxel of the appertaining material is very small, or even zero in the extreme case. The appertaining nuclei of the appertaining dielectric material 3 then no longer contribute to the imaging.

The relaxation time of the proton nuclear spins of the dielectric material after this preparation pulse is a few hundred ms. For measurements in which the repetition time of the measurement is less in comparison to this, for example 10 ms, it is sufficient to emit such a preparation pulse sequence just before each tenth image acquisition pulse sequence. In contrast, in scans longer repetition times in the range of 100 ms, a corresponding preparation pulse sequence would have to be inserted before each image acquisition pulse sequence.

In this method, it is also possible to initially radiate a spectrally-selective radio-frequency saturation pulse, which causes a tilting of α>90°, and then to wait until the appertaining nuclei are relaxed back to approximately 90° in order to emit the spoiler pulse.

In a second variant, initially a spectral saturation pulse is radiated which causes a tilting by α=180°. It is then waited until the longitudinal magnetization of the spectrally excited nuclei of the dielectric material 3 of the dielectric element 1 has its zero-crossing. The image acquisition pulse sequence is then emitted at this point in time.

FIG. 3 shows an exemplary embodiment for a magnetic resonance system 5 with which a measurement is possible according to the previously specified method. The basic component of this magnetic resonance system 5 is a conventional scanner 6 in which a patient P on a bed 4 is positioned in an annular basic field magnet. A radio-frequency antenna 7 to emit the RF pulses is located within the basic field magnet, Moreover, in a typical manner the scanner 6 has gradient coils 9, of which only one is shown in FIG. 3. Three gradient coils are normally located in scanner 6, in order to be able to apply magnetic field gradients in each spatial direction.

The scanner 6 is operated by a control device 10, which is shown separately here. A console 17 is connected to the control device 10. This console 17 has a monitor, a keyboard and a display device for a user interface, for example a mouse. The console 17 serves, among other things, as a user interface via which a user operates the control device 10 and therewith the scanner 6.

The control device 10 is here connected with the scanner 6 via interfaces 13, 14, but both the control device 10 and the console 17 can be integral components of the scanner 6.

The entire magnetic resonance system 5 also includes all further typical components or features such as, for example, an image information system. These components are not shown in FIG. 3 for better clarity.

Via the console 17, the operator can communicate with an activation unit 16, which activates the scanner 6 via the interface 13 and, for example, provides for an emission of the desired RF pulse sequences by the antenna 7 and switches the gradient coils 9 in a suitable manner in order to implement the desired measurements. The raw image data $D_B$ coming from the scanner 6 are acquired via the interface 14. From these raw image data $D_B$, the images are reconstructed in an evaluation unit 15. These images can then be shown, for example, on the monitor of the console 17 and/or be stored in a memory 12 of the control device 10.

The activation unit 16 and the signal evaluation unit 15 preferably are software modules that are realized in a programmable processor 11 of the control device 10. The memory 12 also can be an external mass memory to which the control device 10 has access, for example via a network.

In the shown magnetic resonance system 5, the activation unit 16 in the form of a software module (for example as a program sub-unit) has a preparation sequence unit 18 that causes the measurement sequences emitted in a typical form for specific measurements to be modified such that a dielectric element 1 located in the examination volume 8 in the scanner 6 is not detected in the image acquisition. This ensues in the shown exemplary embodiment by—as previously described—automatic preparation pulse sequences being inserted between the individual image acquisition pulse sequences. These preparation pulse sequences saturate the dielectric material 3 of the dielectric element 1 so that it is not visible in the reconstructed images.

The insertion of the preparation pulse sequences can ensue wholly automatically, such that no additional effort for the operator is needed. If applicable, the user can enter, via the console 17, an indication that a specific dielectric element is being used. The appertaining data for the respective dielectric element, such as, for example, the information about the position of the various magnetic resonance lines of the material used, then can be stored in the memory 12. Based on these data, as well as on the basis of the selected repetition times, etc., a preparation pulse sequence can then be automatically calculated and, using the typical image acquisition pulse sequences and the calculated preparation pulse sequences, the matching measurement sequences can finally be generated. The scanner 6 is then activated via the interface 13 to execute these sequences.

The above-described method as well as the shown magnetic resonance system are only exemplary embodiments, which can be modified in various ways by those skilled in the art without departing from the scope of the invention. In particular, instead of the described measurement sequence, other measurement sequences can be used. Although the invention has been specified in the example of magnetic resonance apparatuses in the medical field, the usage possibilities of the invention are not limited to this field. The invention can likewise be utilized in magnetic resonance apparatuses in any scientific or industrial field.

We claim as our invention:

1. A method for generating a magnetic resonance image of a subject, comprising the steps of:

forming a dielectric element substantially of a dielectric material having a high dielectric constant and exhibiting only at least one magnetic resonance line that does not coincide with a magnetic resonance line of water protons for a predetermined magnetic field, and that is shifted by a predetermined amount relative to said magnetic resonance line of water protons;

placing said dielectric element at a position on the subject to locally influence a $B_1$ field distribution; and acquiring raw image data from the subject by generating a magnetic resonance data acquisition sequence, in which said $B_1$ field distribution occurs, and which causes said dielectric material to produce no signal contribution to said raw image data, or to generate a signal that can be separated from magnetic resonant signals caused by the subject.

2. A method as claimed in claim 1 comprising employing a dielectric material in said dielectric element wherein said at least one magnetic resonance signal line of said dielectric material exhibits a relative separation of approximately 3.3 ppm from said magnetic resonance line of water protons.

3. A method as claimed in claim 1 comprising employing a dielectric material in said dielectric element wherein said at least one magnetic resonance signal line of said dielectric material exhibits a relative separation of more than 3.3 ppm from said magnetic resonance line of water protons.

4. A method as claimed in claim 1 comprising employing a dielectric material in said dielectric element wherein said at least one magnetic resonance signal line of said dielectric material exhibits a relative separation of approximately 3.3 ppm from said magnetic resonance line of protons bonded in body fat.

5. A method as claimed in claim 4 comprising employing a dielectric material in said dielectric element wherein said at least one magnetic resonance signal line of said dielectric material exhibits a relative separation of approximately 6.6 ppm from said magnetic resonance line of water protons.

6. A method as claimed in claim 1 comprising selecting said dielectric material of said dielectric element from the group of dielectric materials consisting of organic carbonates and mixtures of organic carbonates.

7. A method as claimed in claim 1 comprising selecting said dielectric material of said dielectric element from the group of dielectric materials consisting of cyclical carbonates and mixtures of cyclical carbonates.

8. A method as claimed in claim 1 comprising selecting said dielectric material of said dielectric element from the group of dielectric materials consisting of ethylene carbonate, propylene carbonate, and mixtures of ethylene carbonate and propylene carbonate.

9. A method as claimed in claim 1 comprising employing a sequence, as said data acquisition sequence, in which only materials having at least one predetermined magnetic resonance line are excited.

10. A method as claimed in claim 1 comprising, in said data acquisition sequence, generating a preparation pulse sequence in which said dielectric material of said dielectric element is specifically excited, for causing said dielectric material to supply no signal contribution to subsequent acquisition of said raw image data.

11. A method as claimed in claim 10 comprising employing, as said data acquisition sequence, said preparation pulse sequence followed by a plurality of raw data acquisition pulse sequences.

12. A dielectric element adapted for positioning on a subject for locally influencing a $B_1$ field distribution during acquisition of magnetic resonance data from the subject, said dielectric element having a high dielectric constant and being comprised substantially of a dielectric material having at least one magnetic resonance line shifted by a predetermined amount relative to a magnetic resonance line of water protons for a predetermined magnetic field.

13. A dielectric element as claimed in claim 12 comprising an exterior solid jacket surrounding said dielectric material.

14. A magnetic resonance system comprising:

a magnetic resonance scanner configured to interact with a subject therein to acquire magnetic resonance signals from the subject, including an RF system that produces a $B_1$ field distribution;

a dielectric element comprised substantially of a dielectric material having a high dielectric constant and exhibiting only at least one magnetic resonance line that does not coincide with a magnetic resonance line of water protons for a predetermined magnetic field, and that is shifted by a predetermined amount relative to said magnetic resonance line of water protons, said dielectric element being placeable at a position on the subject to locally influence said $B_1$ field distribution; and said magnetic resonance scanner acquiring raw image data from the subject by generating a magnetic resonance data acquisition sequence, in which said $B_1$ field distribution occurs, and which causes said dielectric material to produce no signal contribution to said raw image data, or to generate a signal that can be separated from magnetic resonant signals caused by the subject.

15. A computer-readable medium encoded with a data structure that is loadable into a control computer of a magnetic resonance scanner, for use with a dielectric element comprised substantially of a dielectric material having a high dielectric constant and exhibiting at least one magnetic resonance line that does not coincide with a magnetic resonance line of water protons for a predetermined magnetic field, and that is shifted by a predetermined amount relative to said magnetic resonance line of water protons, said dielectric element being placeable at a position on the subject to locally influence a $B_1$ field distribution, said data structure programming said control unit to operate said magnetic resonance scanner to acquire raw image data from the subject by generating a magnetic resonance data acquisition sequence, in which said $B_1$ field distribution occurs, and which causes said dielectric material to produce no signal contribution to said raw image data, or to generate a signal that can be separated from magnetic resonant signals caused by the subject.

* * * * *